(12) United States Patent
Chen et al.

(10) Patent No.: US 11,476,133 B2
(45) Date of Patent: Oct. 18, 2022

(54) PICKING APPARATUS WITH HEATING ELEMENT AND TEMPERATURE-CONTROLLED ADHESIVE AND THE METHOD OF USING THE SAME

(71) Applicant: Lextar Electronics Corporation, Hsinchu (TW)

(72) Inventors: Fu-Hsin Chen, Hsinchu (TW); Yu-Chun Lee, Hsinchu (TW)

(73) Assignee: Lextar Electronics Corporation, Hsinchu (TW)

( * ) Notice: Subject to any disclaimer, the term of this patent is extended or adjusted under 35 U.S.C. 154(b) by 430 days.

(21) Appl. No.: 16/693,400

(22) Filed: Nov. 25, 2019

(65) Prior Publication Data

US 2021/0134625 A1 May 6, 2021

(30) Foreign Application Priority Data

Oct. 31, 2019 (TW) .................................. 108139561

(51) Int. Cl.
*H01L 21/67* (2006.01)

(52) U.S. Cl.
CPC .............................. *H01L 21/67144* (2013.01)

(58) Field of Classification Search
CPC ................................................ H01L 21/67144
See application file for complete search history.

(56) References Cited

U.S. PATENT DOCUMENTS 5,297,333 A * 3/1994 Kusaka ................... H01L 24/29
257/E21.511

| | | | |
|---|---|---|---|
| 2002/0036055 A1* | 3/2002 | Yoshimura | .......... H01L 21/6835 156/240 |
| 2004/0154733 A1* | 8/2004 | Morf | ....................... H01L 24/83 156/716 |
| 2018/0277524 A1* | 9/2018 | Moon | ................. H01L 25/0753 |
| 2019/0139794 A1* | 5/2019 | Saketi | ..................... H01L 21/68 |
| 2019/0252221 A1* | 8/2019 | Chen | .................... H01L 21/6835 |
| 2019/0252350 A1* | 8/2019 | Schwarz | ................ B65G 47/90 |
| 2020/0144092 A1* | 5/2020 | Radauscher | .......... H01L 24/29 |

FOREIGN PATENT DOCUMENTS

| CN | 109860157 A | 6/2019 |
|---|---|---|
| JP | 2018-74024 A | 5/2018 |
| TW | 201820492 A | 6/2018 |
| TW | 201916225 A | 4/2019 |
| TW | 201919137 A | 5/2019 |
| TW | 201921635 A | 6/2019 |

* cited by examiner

*Primary Examiner* — Lex H Malsawma
(74) *Attorney, Agent, or Firm* — CKC & Partners Co., LLC (57) ABSTRACT

A picking apparatus is configured to pick up a plurality of micro elements. The picking apparatus includes an elastic plate, a substrate, a temperature-controlled adhesive layer, at least one heating element and a power source. The elastic plate has a first surface and a second surface opposite to each other. The substrate is disposed on the first surface. The temperature-controlled adhesive layer is disposed on the second surface and configured to adhere the micro elements. The heating element is disposed between the second surface and the temperature-controlled adhesive layer. The power source is electrically connected with the heating element. A viscosity of the temperature-controlled adhesive layer varies with a temperature of the temperature-controlled adhesive layer.

8 Claims, 5 Drawing Sheets

```
┌─────────────────────────────────────────────────────┐
│ Conducting the electricity to at least one of the   │ ─── 910
│ heating elements to heat up the heating element     │
└─────────────────────────────────────────────────────┘
                          ↓
┌─────────────────────────────────────────────────────┐
│ Conducting the heat from the heated heating element │
│ to the temperature-controlled adhesive layer until  │
│ the temperature of the temperature-controlled       │ ─── 920
│ adhesive layer increases to the first temperature   │
│ in order to increase the viscosity of the           │
│ temperature-controlled adhesive layer               │
└─────────────────────────────────────────────────────┘
                          ↓
┌─────────────────────────────────────────────────────┐
│ Adhering the microscopic elements by the            │
│ temperature-controlled adhesive layer with the      │ ─── 930
│ increased viscosity                                 │
└─────────────────────────────────────────────────────┘
                          ↓
┌─────────────────────────────────────────────────────┐
│ Stopping conducting the electricity to the heating  │
│ element after the microscopic elements contact with │
│ the receiving substrate such that the temperature   │
│ of the temperature-controlled adhesive layer        │ ─── 940
│ decreases to the second temperature in order to     │
│ decrease the viscosity of the temperature-controlled│
│ adhesive layer                                      │
└─────────────────────────────────────────────────────┘
                          ↓
┌─────────────────────────────────────────────────────┐
│ Placing the microscopic elements on the receiving   │
│ substrate and moving the temperature-controlled     │ ─── 950
│ adhesive layer away from the receiving substrate    │
└─────────────────────────────────────────────────────┘
```

Fig. 9

PICKING APPARATUS WITH HEATING ELEMENT AND TEMPERATURE-CONTROLLED ADHESIVE AND THE METHOD OF USING THE SAME

RELATED APPLICATIONS

This application claims priority to Taiwanese Application Serial Number 108139561, filed Oct. 31, 2019, which is herein incorporated by reference.

BACKGROUND

Technical Field

The present disclosure relates to a picking apparatus and a picking method. More particularly, the present disclosure relates to a picking apparatus and a picking method for micro elements.

Description of Related Art

With the advancement of technology, electronic products have been largely integrated into the lives of consumers. In order to meet the needs of consumers, apart from the continuous improvement of the performance of electronic products, electronic products are becoming more lightweight in design.

However, in the production process of the electronic products, how to effectively handle and transfer a large amount of components with decreasing volumes and weights is undoubtedly an important issue for the development of the industry.

SUMMARY

A technical aspect of the present disclosure is to provide a picking apparatus, which can selectively pick up the micro elements adhered on the carrier substrate.

According to an embodiment of the present disclosure, a picking apparatus is configured to pick up a plurality of micro elements. The picking apparatus includes an elastic plate, a substrate, a temperature-controlled adhesive layer, at least one heating element and a power source. The elastic plate has a first surface and a second surface opposite to each other. The substrate is disposed on the first surface. The temperature-controlled adhesive layer is disposed on the second surface and configured to adhere the micro elements. The heating element is disposed between the second surface and the temperature-controlled adhesive layer. The power source is electrically connected with the heating element. A viscosity of the temperature-controlled adhesive layer varies with a temperature of the temperature-controlled adhesive layer.

In one or more embodiments of the present disclosure, the viscosity of the temperature-controlled adhesive layer increases when the temperature of the temperature-controlled adhesive layer increases.

In one or more embodiments of the present disclosure, the viscosity of the temperature-controlled adhesive layer decreases when the temperature of the temperature-controlled adhesive layer decreases.

In one or more embodiments of the present disclosure, a quantity of the heating element is plural. The heating elements are evenly distributed between the second surface and the temperature-controlled adhesive layer.

In one or more embodiments of the present disclosure, the substrate includes glass, quartz, silicon, ceramic or sapphire.

In one or more embodiments of the present disclosure, the elastic plate includes polydimethylsiloxane (PDMS).

According to an embodiment of the present disclosure, a picking method for picking up a plurality of micro elements is provided. The picking method includes conducting an electricity to at least one heating element to heat up the heating element; conducting a heat from the heated heating element to a temperature-controlled adhesive layer until a temperature of the temperature-controlled adhesive layer increases to a first temperature in order to increase a viscosity of the temperature-controlled adhesive layer; and adhering the micro elements by the temperature-controlled adhesive layer with an increased viscosity.

In one or more embodiments of the present disclosure, the picking method further includes stopping conducting the electricity to the heating element after the micro elements contact with a receiving substrate such that the temperature of the temperature-controlled adhesive layer decreases to a second temperature in order to decrease the viscosity of the temperature-controlled adhesive layer; and placing the micro elements on the receiving substrate and moving the temperature-controlled adhesive layer away from the receiving substrate.

In one or more embodiments of the present disclosure, a quantity of the heating element is plural. The procedure of stopping conducting the electricity further includes stopping conducting the electricity to at least one of the heating elements and keeping conducting the electricity to at least another one of the heating elements.

In one or more embodiments of the present disclosure, the first temperature ranges between about 80 degrees Celsius (° C.) and about 120 degrees Celsius (° C.), and the second temperature ranges between about 25 degrees Celsius (° C.) and about 35 degrees Celsius (° C.).

When compared with the prior art, the above-mentioned embodiments of the present disclosure have at least the following advantages:

(1) The user can selectively pick up the micro elements adhered on the carrier substrate according to the way of distribution and the actual positions of the heating elements.

(2) Since the operation to adhere the micro elements to the temperature-controlled adhesive layer or detach the micro elements from the temperature-controlled adhesive layer is by just conducting or stopping conducting the electricity to the heating elements, the way of operation is simple and easy. Therefore, the operation to transfer the micro elements from the carrier substrate to the receiving substrate can be obviously convenient to the user.

(3) Through stopping or keeping conducting the electricity to the heating elements selectively, the user can place the corresponding micro elements from the picking apparatus to the receiving substrate, or allow the micro elements to leave from the receiving substrate with the picking apparatus, in a simple and easy manner.

BRIEF DESCRIPTION OF THE DRAWINGS

The disclosure can be more fully understood by reading the following detailed description of the embodiments, with reference made to the accompanying drawings as follows.

DETAILED DESCRIPTION

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
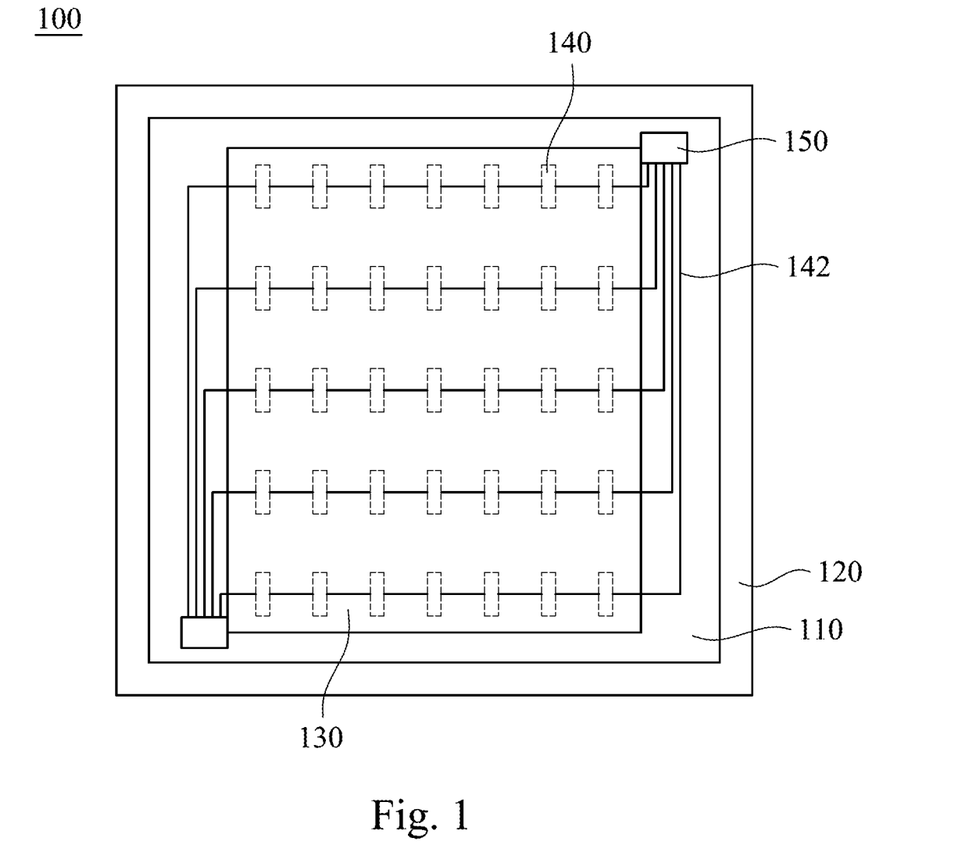
FIG. 1 is a front view of a picking apparatus according to an embodiment of the present disclosure.
Figure 2:
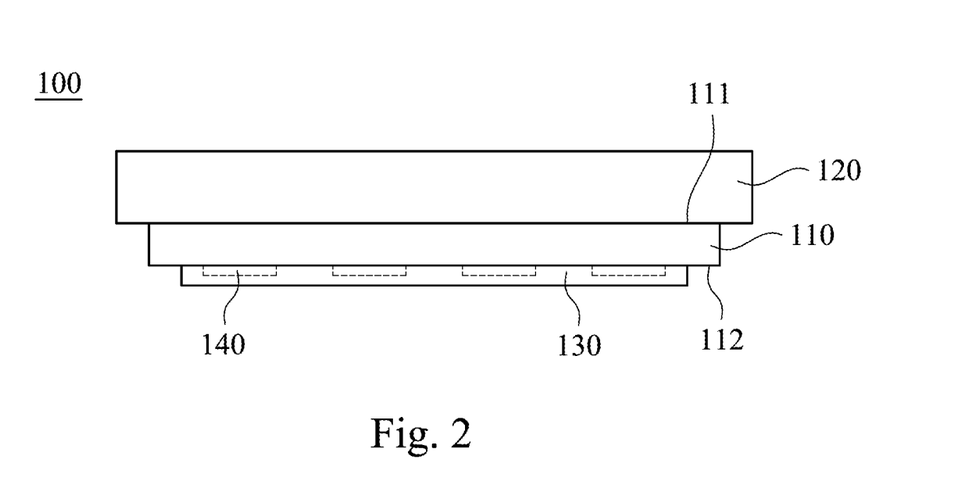
FIG. 2 is a side view of the picking apparatus of FIG. 1.

Reference is made to FIG. 1 and FIG. 2. FIG. 1 is a front view of a picking apparatus 100 according to an embodiment of the present disclosure. FIG. 2 is a side view of the picking apparatus 100 of FIG. 1. In this embodiment, the present disclosure provides a picking apparatus 100 configured to pick up a plurality of micro elements 200 (please refer to FIGS. 3-7). As shown in FIGS. 1-2, a picking apparatus 100 includes an elastic plate 110, a substrate 120, a temperature-controlled adhesive layer 130, at least one heating element 140 and a power source 150. The elastic plate 110 has a first surface 111 and a second surface 112 opposite to each other. The substrate 120 is disposed on the first surface 111 of the elastic plate 110. The temperature-controlled adhesive layer 130 is disposed on the second surface 112 of the elastic plate 110. Moreover, the temperature-controlled adhesive layer 130 is configured to adhere the micro elements 200. The heating element 140 can be a metal of a relatively high electric resistance and is disposed between the second surface 112 of the elastic plate 110 and the temperature-controlled adhesive layer 130. The power source 150 is electrically connected with the heating element 140. In addition, the second surface 112 of the elastic plate 110 is configured with a plurality of heating circuits 142. The heating circuits 142 are connected between the power source 150 and the heating element 140. When the power source 150 is switched on, the power source 150 supplies an electricity to the heating element 140 through the heating circuits 142, so as to adjust the increase or decrease of the temperature of the temperature-controlled adhesive layer 130. A viscosity of the temperature-controlled adhesive layer 130 varies with the increase or decrease of the temperature of the temperature-controlled adhesive layer 130. In practical applications, the micro elements 200 can be semiconductor chips, micro light emitting diodes (micro-LEDs), electronic elements (such as resistors, capacitors, sensing elements . . . ), etc. However, this does not intend to limit the present disclosure.

To be more specific, the viscosity of the temperature-controlled adhesive layer 130 increases when the temperature of the temperature-controlled adhesive layer 130 increases, and the viscosity of the temperature-controlled adhesive layer 130 decreases when the temperature of the temperature-controlled adhesive layer 130 decreases.

In practical applications, the substrate 120 can include materials such as glass, quartz, silicon, ceramic or sapphire. On the other hand, the elastic plate 110 can be of elastomer of polymer material, such as elastic polymer material. For example, the elastic plate 110 can include polyoxyalkylene material, such as polydimethylsiloxane (PDMS). However, it should be noted that the types of material of the substrate 120 and the elastic plate 110 as cited herein are only illustrative and are not to limit the claimed scope. A person having ordinary skill in the art of the present disclosure may appropriately choose the types of material of the substrate 120 and the elastic plate 110 according to the actual needs.

According to the actual situation, a quantity of the heating element 140 is plural, and the heating elements 140 are evenly distributed between the second surface 112 of the elastic plate 110 and the temperature-controlled adhesive layer 130. In this embodiment, as shown in FIG. 1 and FIG. 2, the heating elements 140 are arranged in the form of a matrix between the second surface 112 of the elastic plate 110 and the temperature-controlled adhesive layer 130.

Figure 3:
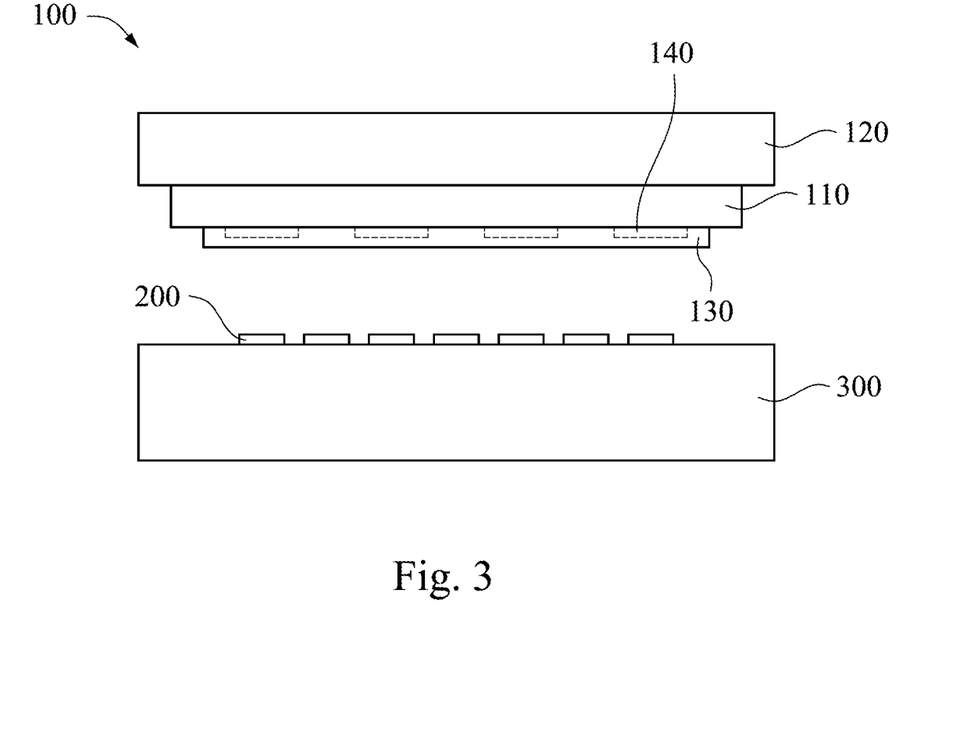
FIG. 3 is a side view of the picking apparatus of FIG. 1, in which the picking apparatus is ready to pick up a plurality of micro elements.

Reference is made to FIG. 3. FIG. 3 is a side view of the picking apparatus 100 of FIG. 1, in which the picking apparatus 100 is ready to pick up the micro elements 200. In this embodiment, as shown in FIG. 3, the micro elements 200 are originally adhered on a carrier substrate 300. The carrier substrate 300 is used for carrying the micro elements 200 to facilitate the subsequent working procedures. In an embodiment, the carrier substrate 300 can be a growth substrate for micro elements. Taking the micro elements 200 to be micro light emitting diodes (micro-LEDs) as an example, the growth substrate is a semiconductor epitaxial wafer used to form micro-LEDs thereon. Before the picking apparatus 100 picks up the micro elements 200 from the carrier substrate 300, the user uses first the power source 150 (please refer to FIG. 1) to conduct an electricity to the heating elements 140, such that the heating elements 140 are heated up due to their own electric resistances. The heat of the heating elements 140 is then conducted to the temperature-controlled adhesive layer 130 which is mutually connected with the heating elements 140, such that the temperature-controlled adhesive layer 130 is heated up to a first temperature. As mentioned above, the viscosity of the temperature-controlled adhesive layer 130 increases when the temperature of the temperature-controlled adhesive layer 130 increases. Therefore, when the temperature of the temperature-controlled adhesive layer 130 increases to the first temperature, the viscosity of the temperature-controlled adhesive layer 130 increases to a first viscosity correspondingly. In this embodiment, the first temperature ranges between about 80 degrees Celsius (° C.) and about 120 degrees Celsius (° C.). However, this does not intend to limit the present disclosure.

Figure 4:
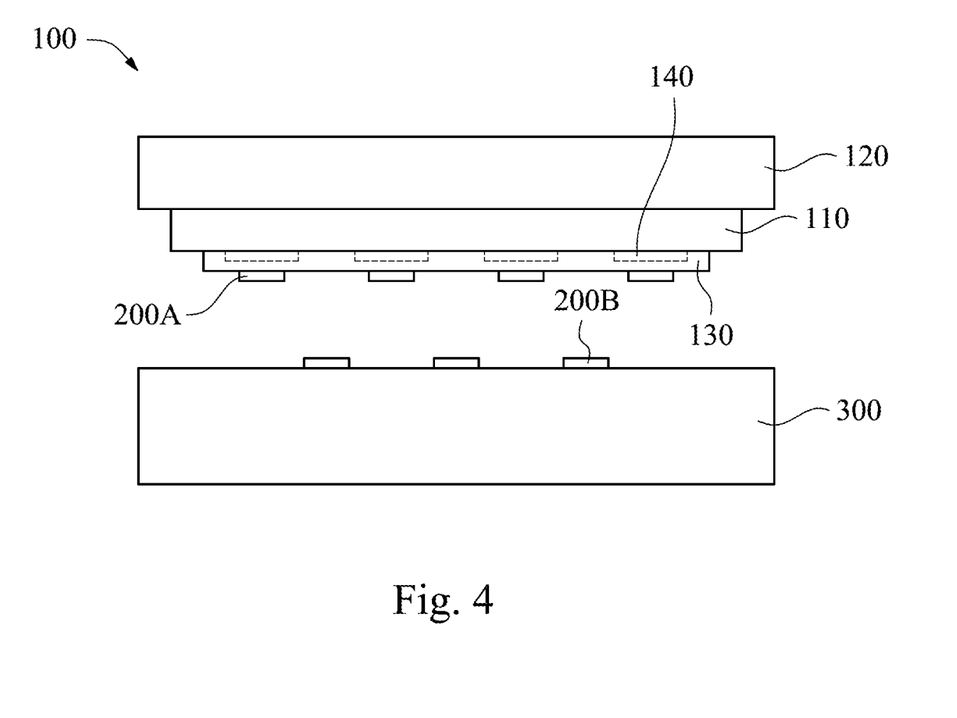
FIG. 4 is a side view of the picking apparatus of FIG. 1, in which the picking apparatus has picked up the micro elements.

Reference is made to FIG. 4. FIG. 4 is a side view of the picking apparatus 100 of FIG. 1, in which the picking apparatus 100 has picked up the micro elements 200A. After the viscosity of the temperature-controlled adhesive layer 130 increases to the first viscosity, the user can make the picking apparatus 100 approach to the carrier substrate 300 and use the temperature-controlled adhesive layer 130 to contact with the micro elements 200A. Since the viscosity of the temperature-controlled adhesive layer 130 increases to the first viscosity, the temperature-controlled adhesive layer 130 is able to effectively adhere the micro elements 200A, as shown in FIG. 4. In contrast, the adhesive force that the micro elements 200A are adhered to the carrier substrate 300 is less than the first viscosity of the temperature-controlled adhesive layer 130. Therefore, when the picking apparatus 100 leaves with the micro elements 200A adhered and transfers to the next working point, the micro elements 200A adhere to the temperature-controlled adhesive layer 130 and leave with the picking apparatus 100, but not to be adhered by the carrier substrate 300 to continue to stay on the carrier substrate 300.

It is worth to note that, in this embodiment, as mentioned above, the heating elements 140 are arranged in the form of a matrix between the second surface 112 of the elastic plate 110 and the temperature-controlled adhesive layer 130. Therefore, when the heating elements 140 are heated up due to their own electric resistances, the areas of the temperature-controlled adhesive layer 130 which are heated up locally correspond to the matrix arrangement of the heating elements 140. In other words, when the areas of the temperature-controlled adhesive layer 130 corresponding to the positions of the heating elements 140 are heated up to the first temperature, the areas of the temperature-controlled adhesive layer 130 corresponding to the regions between the heating elements 140 are not heated up to the first temperature.

In this way, the user can selectively pick up the micro elements 200A adhered on the carrier substrate 300 according to the way of distribution and the actual positions of the heating elements 140, and none of the micro elements 200B will be picked up by mistake. As shown in FIG. 4, after the picking apparatus 100 has completed the action of picking up the micro elements 200 and leaves from the carrier substrate 300, only the micro elements 200A corresponding to the positions of the heating elements 140 are picked up and adhered to the temperature-controlled adhesive layer 130, and the micro elements 200B not corresponding to the positions of the heating elements 140 maintain to adhere on the carrier substrate 300.

Figure 5:
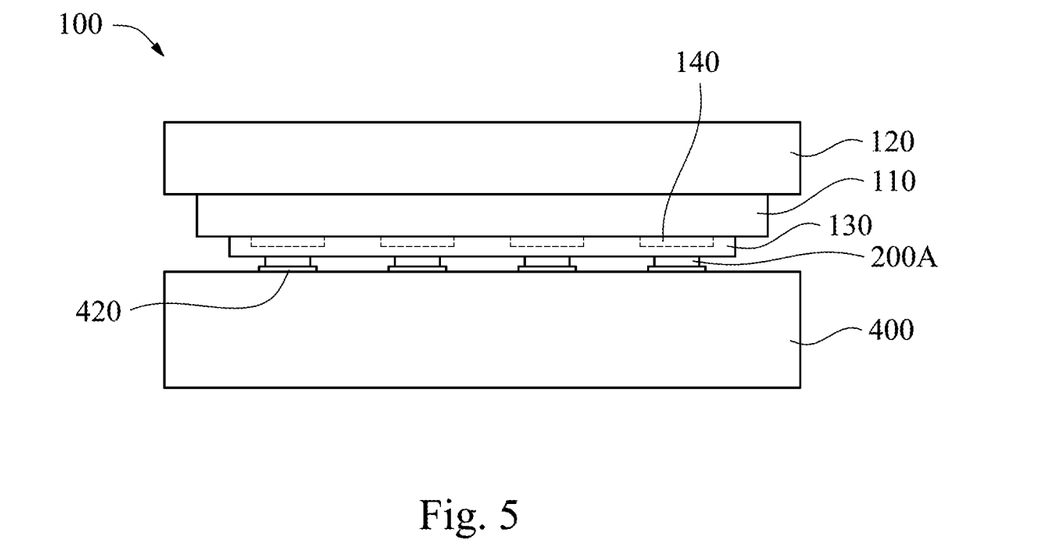
FIG. 5 is a side view of the picking apparatus of FIG. 1, in which the picking apparatus approaches a receiving substrate.
Figure 6:
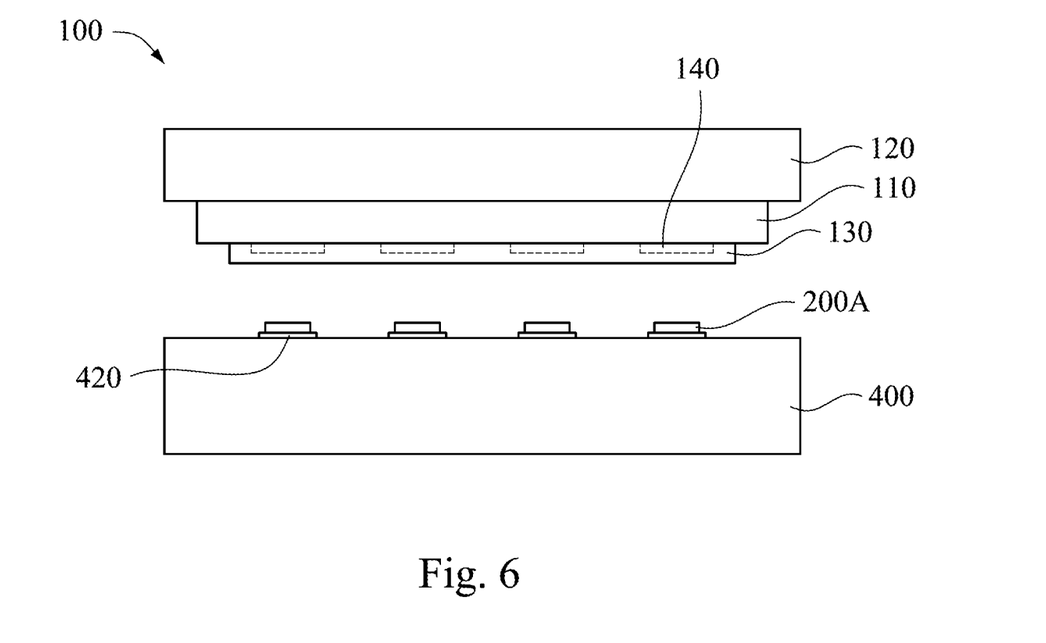
FIG. 6 is a side view of the picking apparatus of FIG. 1, in which the picking apparatus places the micro elements on the receiving substrate.

Reference is made to FIGS. 5-6. FIG. 5 is a side view of the picking apparatus 100 of FIG. 1, in which the picking apparatus 100 approaches a receiving substrate 400. FIG. 6 is a side view of the picking apparatus 100 of FIG. 1, in which the picking apparatus 100 places the micro elements 200A on the receiving substrate 400.

After the picking apparatus 100 has completed the action of picking up the micro elements 200A and leaves from the carrier substrate 300, the picking apparatus 100 transfers the micro elements 200A to the receiving substrate 400. The receiving substrate 400 can be a temporary substrate or a circuit substrate. However, this does not intend to limit the present disclosure. As shown in FIG. 5 and FIG. 6, the receiving substrate 400 is a circuit substrate in the embodiment, and a surface of the circuit substrate is disposed with a plurality of curable adhesive materials 420. The picking apparatus 100 approaches the receiving substrate 400 and controls to align the micro elements 200A with the positions of the curable adhesive materials 420, such that the micro elements 200A can be fixed on the receiving substrate 400 through the curable adhesive materials 420.

For example, after the micro elements 200A contact with the receiving substrate 400, the power source 150 stops conducting the electricity to the heating elements 140, such that the temperature of the temperature-controlled adhesive layer 130 decreases to a second temperature. As mentioned above, the viscosity of the temperature-controlled adhesive layer 130 decreases when the temperature of the temperature-controlled adhesive layer 130 decreases. Therefore, when the temperature of the temperature-controlled adhesive layer 130 decreases to the second temperature, the viscosity of the temperature-controlled adhesive layer 130 decreases to a second viscosity correspondingly. In addition, the second viscosity is less than the first viscosity. In other words, the temperature-controlled adhesive layer 130 has a weaker adhesive force at the second temperature than at the first temperature. In this embodiment, for example, the second temperature ranges between about 25 degrees Celsius (° C.) and about 35 degrees Celsius (° C.). However, this does not intend to limit the present disclosure.

After the micro elements 200A contact with the receiving substrate 400 and the viscosity of the temperature-controlled adhesive layer 130 decreases to the second viscosity, the micro elements 200A can no longer be adhered to the temperature-controlled adhesive layer 130 and are placed on the receiving substrate 400, as shown in FIG. 6. Moreover, the micro elements 200A are fixed on the receiving substrate 400 through the curable adhesive materials 420, and the temperature-controlled adhesive layer 130 moves away from the receiving substrate 400. In this way, the process to transfer the micro elements 200A from the carrier substrate 300 to the receiving substrate 400 is completed.

Since the operation to adhere the micro elements 200A to the temperature-controlled adhesive layer 130 or detach the micro elements 200A from the temperature-controlled adhesive layer 130 is by just conducting or stopping conducting the electricity to the heating elements 140, the way of operation is simple and easy. Therefore, the operation to transfer the micro elements 200A from the carrier substrate 300 to the receiving substrate 400 can be obviously convenient to the user.

Figure 7:
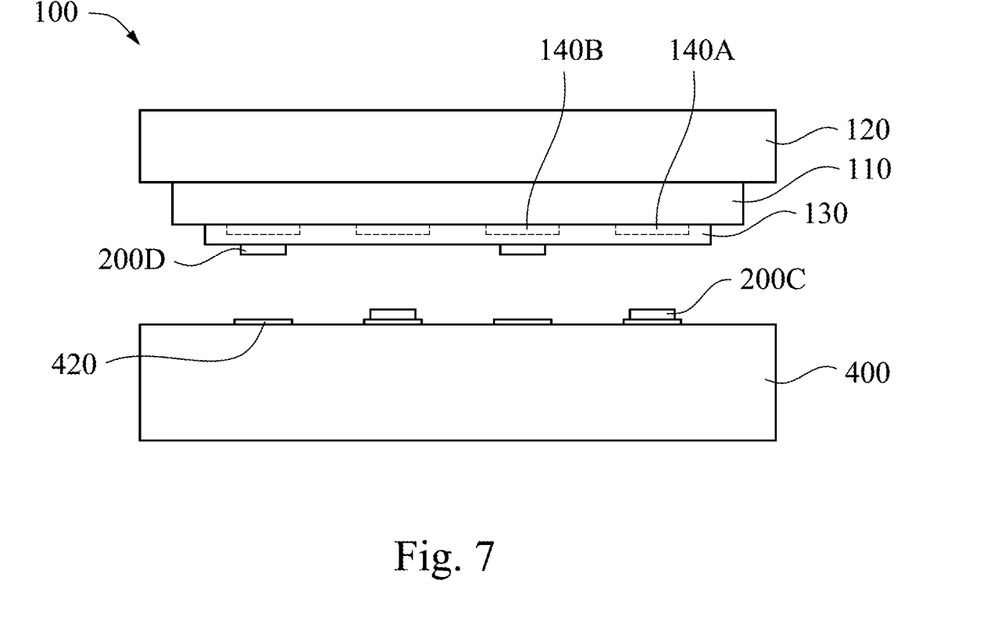
FIG. 7 is a side view of the picking apparatus of FIG. 1, in which the picking apparatus places some of the micro elements on the receiving substrate.

In addition, according to the actual situation, the procedure of stopping conducting the electricity to the heating elements 140 further includes when a quantity of the heating element 140 is plural, stopping conducting the electricity to at least one of the heating elements 140 and keeping conducting the electricity to at least another one of the heating elements 140. When the user wants to selectively place the micro elements 200 adhered to the temperature-controlled adhesive layer 130 on the receiving substrate 400, the user can correspondingly stop conducting the electricity to the relevant heating elements 140A, and keep conducting the electricity to the remaining heating elements 140B, as shown in FIG. 7. FIG. 7 is a side view of the picking apparatus 100 of FIG. 1, in which the picking apparatus 100 places some of the micro elements 200C on the receiving substrate 400. To be specific, for the areas of the temperature-controlled adhesive layer 130 with positions corresponding to the heating elements 140B conducted with the electricity, the viscosities remain to be the first viscosity, while for the areas of the temperature-controlled adhesive layer 130 with positions corresponding to the heating elements 140A stopped with the electrical conduction, the viscosities decrease to the second viscosity. The micro elements 200C adhered to the temperature-controlled adhesive layer 130 with the second viscosity only can no longer be adhered to the temperature-controlled adhesive layer 130, the micro elements 200C are then adhered to the receiving substrate 400. On the contrary, the micro elements 200D adhered to the temperature-controlled adhesive layer 130 with the first viscosity can leave from the receiving substrate 400 with the temperature-controlled adhesive layer 130 and will not adhere to the receiving substrate 400. In this way, through stopping or keeping conducting the electricity to the heating elements 140 selectively, the user can place the corresponding micro elements 200C from the picking apparatus 100 to the receiving substrate 400, or allow the micro elements 200D to leave from the receiving substrate 400 with the picking apparatus 100, in a simple and easy manner.

In an embodiment, the curable adhesive materials 420 on the receiving substrate 400 can be welding material. The welding material has conductive component and can form eutectic bonds under a high temperature to weld the micro elements 200 on the receiving substrate 400 in order to form a rigid connection structure having an adhesive force far larger than the adhesive force between the micro elements 200 and the temperature-controlled adhesive layer 130. Under this situation, even if the power source 150 does not stop conducting the electricity to the heating elements 140 to decrease the viscosity of the temperature-controlled adhesive layer 130, when the picking apparatus 100 moves away from the receiving substrate 400, the micro elements 200 will stay on the receiving substrate 400 because of the rigid connection structure and will not leave with the picking apparatus 100.

Therefore, it can be understood that the present disclosure can be applied to the transfer of the micro elements 200 and can assist to manufacture devices with the micro elements 200. Taking the manufacture of displays with micro light emitting diodes (micro-LEDs) as an example, the micro elements 200 are micro-LED chips. By the picking apparatus 100 of the present disclosure, the micro-LED chips 200 are transferred from the carrier substrate 300 to the receiving substrate 400, in which the receiving substrate 400 is a circuit substrate of the display, such as thin film transistor substrate, glass substrate including conductive lines, quartz substrate or silicon substrate.

Figure 8:
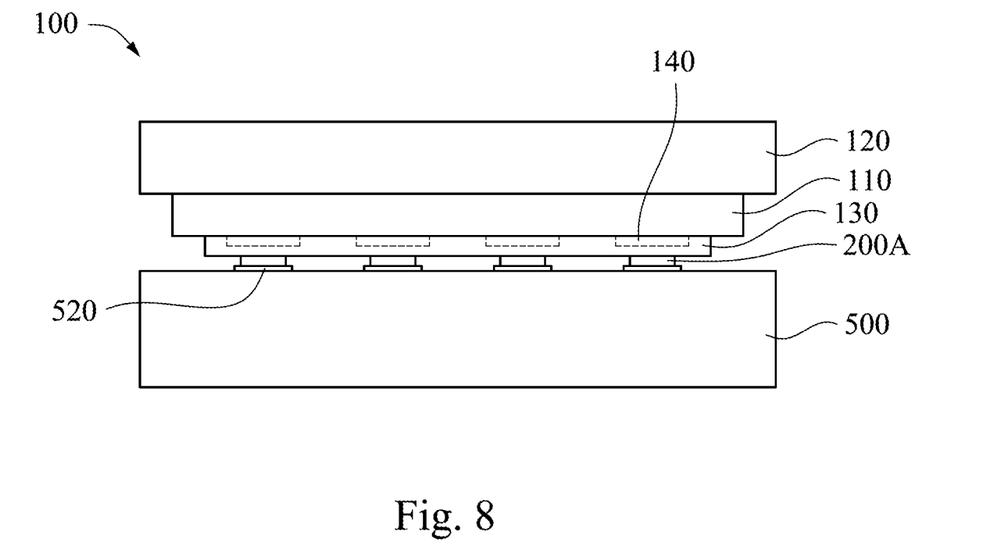
FIG. 8 is a side view of the picking apparatus of FIG. 1, in which the picking apparatus approaches another receiving substrate.

Reference is made to FIG. 8. FIG. 8 is a side view of the picking apparatus 100 of FIG. 1, in which the picking apparatus 100 approaches another receiving substrate 500. In FIG. 8, the receiving substrate 500 is a temporary substrate, and a surface of the temporary substrate is disposed with a plurality of curable adhesive materials 520 (according to the actual situation, the curable adhesive materials 520 can be mutually connected to form a single layer, which does not intend to limit the present disclosure however). Moreover, the curable adhesive materials 520 can be adhesive materials without conductivity, such as silicone or epoxy resin. With reference to FIG. 4, after the picking apparatus 100 picks up the micro elements 200A from the carrier substrate 300 and is ready to transfer the micro elements 200A to the receiving substrate 500 (as shown in FIG. 8), the power source 150 stops conducting the electricity to the heating elements 140, such that the temperature of the temperature-controlled adhesive layer 130 decreases to the second temperature, and the viscosity of the temperature-controlled adhesive layer 130 decreases to the corresponding second viscosity. After the micro elements 200A contact with the receiving substrate 500 and the viscosity of the temperature-controlled adhesive layer 130 decreases to the second viscosity, the micro elements 200A can no longer be adhered to the temperature-controlled adhesive layer 130. The micro elements 200A are then adhered to the receiving substrate 500 through the curable adhesive materials 520, and the temperature-controlled adhesive layer 130 moves away from the receiving substrate 500. In this way, the process to transfer the micro elements 200A from the carrier substrate 300 to the receiving substrate 500 is completed.

Figure 9:
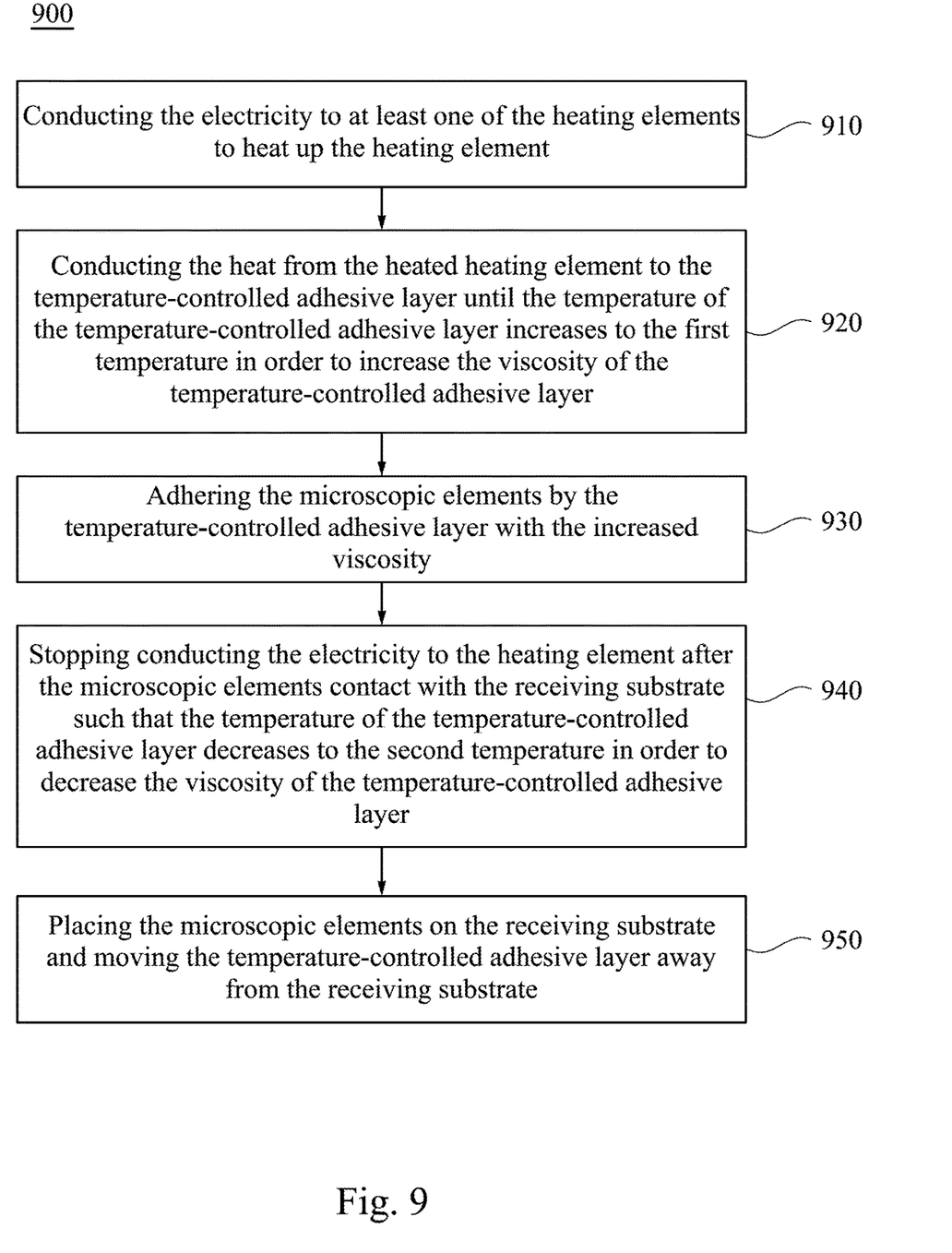
FIG. 9 is a flow diagram of a picking method according to an embodiment of the present disclosure.

Reference is made to FIG. 9. FIG. 9 is a flow diagram of a picking method 900 according to an embodiment of the present disclosure. Apart from the picking apparatus 100 as mentioned above, another aspect of the present disclosure provides a picking method 900. As shown in FIG. 9, the picking method 900 includes the following steps (it should be noted that the sequence of the steps and the sub-steps as mentioned below, unless otherwise specified, can all be adjusted upon the actual needs, or even executed at the same time or partially at the same time):

(1) Conducting the electricity to at least one of the heating elements 140 to heat up the heating element 140 (Step 910).

(2) Conducting the heat from the heated heating element 140 to the temperature-controlled adhesive layer 130 until the temperature of the temperature-controlled adhesive layer 130 increases to the first temperature in order to increase the viscosity of the temperature-controlled adhesive layer 130 (Step 920).

(3) Adhering the micro elements 200 by the temperature-controlled adhesive layer 130 with the increased viscosity (Step 930).

(4) Stopping conducting the electricity to the heating element 140 after the micro elements 200A contact with the receiving substrate 400/500 such that the temperature of the temperature-controlled adhesive layer 130 decreases to the second temperature in order to decrease the viscosity of the temperature-controlled adhesive layer 130 (Step 940).

(5) Placing the micro elements 200A on the receiving substrate 400/500 and moving the temperature-controlled adhesive layer 130 away from the receiving substrate 400/500 (Step 950).

In conclusion, when compared with the prior art, the aforementioned embodiments of the present disclosure have at least the following advantages:

(1) The user can selectively pick up the micro elements adhered on the carrier substrate according to the way of distribution and the actual positions of the heating elements.

(2) Since the operation to adhere the micro elements to the temperature-controlled adhesive layer or detach the micro elements from the temperature-controlled adhesive layer is by just conducting or stopping conducting the electricity to the heating elements, the way of operation is simple and easy. Therefore, the operation to transfer the micro elements from the carrier substrate to the receiving substrate can be obviously convenient to the user.

(3) Through stopping or keeping conducting the electricity to the heating elements selectively, the user can place the corresponding micro elements from the picking apparatus to the receiving substrate, or allow the micro elements to leave from the receiving substrate with the picking apparatus, in a simple and easy manner.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A picking apparatus, configured to pick up a plurality of micro elements, the picking apparatus comprising:
   an elastic plate having a first surface and a second surface opposite to each other;
   a substrate disposed on the first surface;
   a temperature-controlled adhesive layer disposed on the second surface and configured to adhere the micro elements;
   at least one heating element disposed between the second surface and the temperature-controlled adhesive layer; and
   a power source electrically connected with the heating element,
   wherein a viscosity of the temperature-controlled adhesive layer increases when a temperature of the temperature-controlled adhesive layer increases, and the viscosity of the temperature-controlled adhesive layer decreases when the temperature of the temperature-controlled adhesive layer decreases.

2. The picking apparatus of claim 1, wherein a quantity of the heating element is plural, and the heating elements are evenly distributed between the second surface and the temperature-controlled adhesive layer.

3. The picking apparatus of claim 1, wherein the substrate comprises glass, quartz, silicon, ceramic or sapphire.

4. The picking apparatus of claim 1, wherein the elastic plate comprises polydimethylsiloxane (PDMS).

5. A picking method for picking up a plurality of micro elements, the picking method comprising:
   conducting an electricity to at least one heating element to heat up the heating element;
   conducting a heat from the heated heating element to a temperature-controlled adhesive layer until a temperature of the temperature-controlled adhesive layer increases to a first temperature in order to increase a viscosity of the temperature-controlled adhesive layer;
   adhering the micro elements by the temperature-controlled adhesive layer with an increased viscosity; and
   stopping conducting the electricity to the heating element after the micro elements contacting with a receiving substrate such that the temperature of the temperature-controlled adhesive layer decreases to a second temperature in order to decrease the viscosity of the temperature-controlled adhesive layer.

6. The picking method of claim 5, further comprising:
   placing the micro elements on the receiving substrate and moving the temperature-controlled adhesive layer away from the receiving substrate.

7. The picking method of claim 5, wherein a quantity of the heating element is plural, stopping conducting the electricity further comprises:
   stopping conducting the electricity to at least one of the heating elements and keeping conducting the electricity to at least another one of the heating elements.

8. The picking method of claim 5, wherein the first temperature ranges between about 80 degrees Celsius (° C.) and about 120 degrees Celsius (° C.), and the second temperature ranges between about 25 degrees Celsius (° C.) and about 35 degrees Celsius (° C.).

* * * * *